(12) United States Patent
Paruthi et al.

(10) Patent No.: US 8,042,078 B2
(45) Date of Patent: Oct. 18, 2011

(54) ENHANCING FORMAL DESIGN VERIFICATION BY REUSING PREVIOUS RESULTS

(75) Inventors: Viresh Paruthi, Austin, TX (US); Travis W. Pouarz, Austin, TX (US); Mark A. Williams, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 12/416,232

(22) Filed: Apr. 1, 2009

(65) Prior Publication Data

US 2010/0257494 A1    Oct. 7, 2010

(51) Int. Cl.
G06F 9/455 (2006.01)
G06F 17/50 (2006.01)
(52) U.S. Cl. ...................................................... 716/106
(58) Field of Classification Search .................... 716/106
See application file for complete search history.

(56) References Cited

U.S. PATENT DOCUMENTS

| | | | |
|---|---|---|---|
| 5,867,396 A | 2/1999 | Parlour | |
| 7,093,218 B2 | 8/2006 | Baumgartner et al. | |
| 7,181,708 B1 * | 2/2007 | Du et al. | 716/106 |
| 7,587,690 B1 * | 9/2009 | Siarkowski et al. | 716/108 |
| 2005/0102596 A1 * | 5/2005 | Hekmatpour | 714/741 |
| 2007/0089007 A1 * | 4/2007 | Wood et al. | 714/738 |
| 2007/0294650 A1 | 12/2007 | Pandey et al. | |

* cited by examiner

*Primary Examiner* — Suresh Memula
(74) *Attorney, Agent, or Firm* — Dillon & Yudell LLP

(57) ABSTRACT

A method, a system and a computer program product for re-using verification results associated with a circuit design to eliminate a formal verification re-run associated with a subsequent verification of the circuit design. A Verification Data Re-use (VDR) utility initiates the creation of a first netlist data structure and a first set of target signatures for the circuit design. The VDR utility initiates an initial functional verification run of the circuit design and stores the results of the verification run. When a subsequent verification of the initial design is initiated, the VDR utility compares the first set of target signatures with a second set of target signatures for the subsequent verification run. A match of target signatures indicates that corresponding design targets have an identical functionality and the VDR utility re-uses verification results from the initial verification run to eliminate an extensive formal verification re-run for the circuit design.

18 Claims, 7 Drawing Sheets

ENHANCING FORMAL DESIGN VERIFICATION BY REUSING PREVIOUS RESULTS

BACKGROUND

1. Technical Field

The present invention generally relates to electrical circuit design verification systems and in particular to the application of historical verification data in electrical circuit design verification systems.

2. Description of the Related Art

The increasing complexity of modern hardware designs dictates that extremely rigorous functional verification practices are necessary to flush out the majority of circuit design flaws. These verification practices take on many forms, from the running of extensive simulation "regression buckets" that test the design behavior under specific conditions, to more exhaustive semi-formal or formal verification techniques that are executed to determine complete design correctness. Overall, the verification process requires exponential resources with respect to design size. Formal verification therefore tends to be applicable only to smaller designs, and even then run times easily may consume hours, days, or months. Incomplete verification techniques such as simulation and semi-formal approaches consume lesser computational resources and are, thus, scalable to much larger designs. Nevertheless, in order to obtain as much coverage as possible from these incomplete techniques, these verification techniques are often extensively deployed, collectively requiring hours, days or even months of run-time.

One intrinsic design characteristic that complicates the verification process is that the verification process may have to be performed more than once on a given design. The verification process may be performed multiple times because the design evolves many times during the development phase when new functionality is entered, design flaws are rectified, synthesis optimizations are performed on the design to meet timing/size constraints, and pervasive functions are added such as test logic. Despite how small a change may be, unless the change is demonstrated to be very trivial, it is often necessary to re-perform the verification process anew every time the design changes. Multiple runs of the verification process may be a particular bottleneck in the case of a very late design change as in a change that occurs immediately before design fabrication.

SUMMARY OF ILLUSTRATIVE EMBODIMENTS

Disclosed are a method, a system and a computer program product for re-using verification results associated with a circuit design to eliminate a formal verification re-run associated with a subsequent verification of the circuit design. A Verification Data Re-use (VDR) utility initiates the creation of a first netlist (i.e., an electronic design connectivity description) data structure and a first set of target signatures for the circuit design. The VDR utility initiates an initial functional verification run of the circuit design and stores the results of the verification run. When a subsequent verification of the initial design is initiated, the VDR utility compares the first set of target signatures with a second set of target signatures for the subsequent verification run. A match of target signatures indicates that corresponding design targets have an identical functionality and the VDR utility re-uses verification results from the initial verification run to eliminate an extensive formal verification re-run for the circuit design.

The above as well as additional objectives, features, and advantages of the present invention will become apparent in the following detailed written description.

BRIEF DESCRIPTION OF THE DRAWINGS

The invention itself, as well as advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
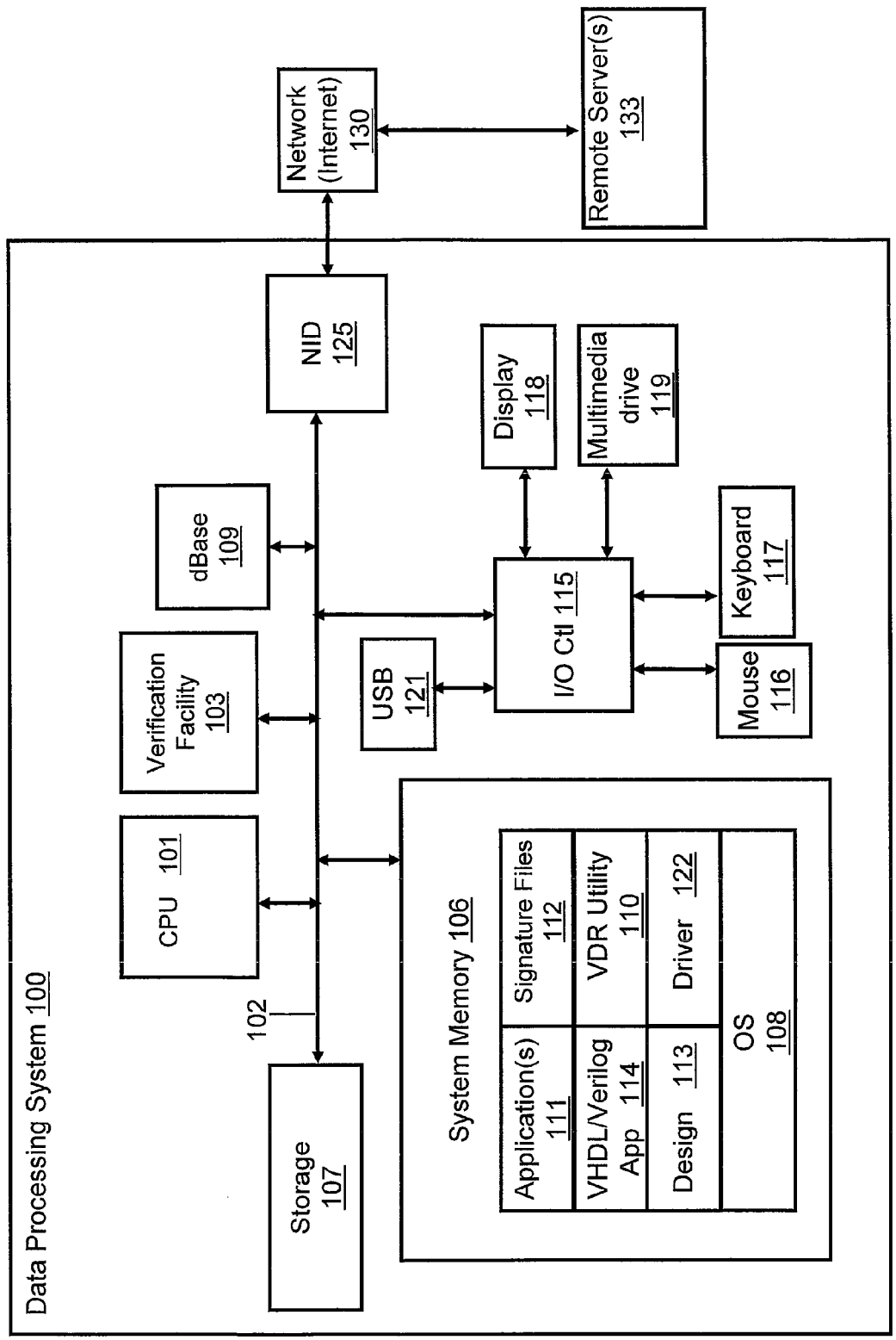
FIG. 1 provides a block diagram representation of a data processing system within which the invention is practiced, according to one embodiment of the invention.

The illustrative embodiments provide a method, a system and a computer program product for re-using verification results associated with a circuit design to eliminate a formal verification re-run associated with a subsequent verification of the circuit design. A Verification Data Re-use (VDR) utility initiates the creation of a first netlist data structure and a first set of target signatures for the circuit design. The VDR utility initiates an initial functional verification run of the circuit design and stores the results of the verification run. When a subsequent verification of the initial design is initiated, the VDR utility compares the first set of target signatures with a second set of target signatures for the subsequent verification run. A match of target signatures indicates that corresponding design targets have an identical functionality and the VDR utility re-uses verification results from the initial verification run to eliminate an extensive formal verification re-run for the circuit design.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

Within the descriptions of the figures, similar elements are provided similar names and reference numerals as those of the previous figure(s). Where a later figure utilizes the element in a different context or with different functionality, the element is provided a different leading numeral representative of the figure number. The specific numerals assigned to the elements are provided solely to aid in the description and not meant to imply any limitations (structural or functional or otherwise) on the described embodiment.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that terms is utilized.

With reference now to the figures, and beginning with FIG. 1, there is depicted a block diagram representation of an example data processing system (DPS), as utilized within one embodiment. DPS may be a computer, a portable device, such as a personal digital assistant (PDA), a smart phone, and/or other types of electronic devices that may generally be considered processing devices. As illustrated, DPS 100 comprises at least one processor or central processing unit (CPU) 101 connected to system memory 106 via system interconnect/bus 102. Database 109 is also connected to system bus 102. Also connected to system bus 102 is input/output (I/O) controller 115, which provides connectivity and control for input devices, of which pointing device (or mouse) 116 and keyboard 117 are illustrated. I/O controller 115 also provides connectivity and control for output devices, of which display 118 is illustrated. Additionally, a multimedia drive 119 (e.g., compact disk read/write (CDRW) or digital video disk (DVD) drive) and USB (universal serial bus) port 121 are illustrated, coupled to I/O controller 115. Multimedia drive 119 and USB port 121 enable insertion of a removable storage device (e.g., optical disk or "thumb" drive) on which data/instructions/code may be stored and/or from which data/instructions/code may be retrieved. DPS 100 also comprises storage 107, within/from which data/instructions/code may also be stored/retrieved.

DPS 100 is also illustrated with a network interface device (NID) 125, by which DPS 100 may connect to one or more access/external networks 130, of which the Internet is provided as one example. In this implementation, the Internet represents/is a worldwide collection of networks and gateways that utilize the Transmission Control Protocol/Internet Protocol (TCP/IP) suite of protocols to communicate with one another. NID 125 may be configured to operate via wired or wireless connection to an access point of the network. Network 130 may be an external network such as the Internet or wide area network (WAN), or an internal network such as an Ethernet (local area network—LAN) or a Virtual Private Network (VPN). Connection to the external network 130 may be established with one or more servers 133, which may also provide data/instructions/code for execution on DPS 100, in one embodiment.

In addition to the above described hardware components of DPS 100, various features of the invention are completed/supported via software (or firmware) code or logic stored within memory 106 or other storage (e.g., storage 107) and executed by CPU 101. Thus, for example, illustrated within memory 106 are a number of software/firmware/logic components, including operating system (OS) 108 (e.g., Microsoft Windows®, a trademark of Microsoft Corp, or GNU®/Linux®, registered trademarks of the Free Software Foundation and The Linux Mark Institute), Very High Speed Integrated Circuits Hardware Description Language (VHDL)/Verilog applications 114, Target Signature Files 112 and verification data re-use (VDR) utility 110. Also included in memory 106 are netlist application 111, design 113 and driver 122. In addition, DPS 100 comprises verification facility 103. In actual implementation, VDR utility 110 may be combined with verification facility 103, applications 111 and Target Signature Files 112 to provide a single executable component, collectively providing the various functions of each individual software component when the corresponding combined code is executed by the CPU 101. For simplicity, VDR utility 110 is illustrated and described as a stand alone or separate software/firmware component, which provides specific functions, as described below.

In one embodiment, server 133 represents a software deploying server, and DPS 100 communicates with the software deploying server (133) via network (e.g., Internet 130) using network interface device 125. Then, VDR utility 110 may be deployed from/on the network, via software deploying server 133. With this configuration, software deploying server performs all of the functions associated with the execution of VDR utility 110. Accordingly, DPS 100 is not required to utilize internal computing resources of DPS 100 to execute VDR utility 110.

CPU 101 executes VDR utility 110 as well as OS 108, which supports the user interface features of VDR utility 110. In the described embodiment, VDR utility 110 generates/provides several graphical user interfaces (GUI) to enable user interaction with, or manipulation of, the functional features of VDR utility 110. Certain functions supported and/or implemented by VDR utility utilize processing logic executed by processor 101 and/or device hardware to complete the implementation of that function. For simplicity of the description, the collective body of code that enables these various functions is referred to herein as VDR utility 110. Among the software code/instructions/logic provided by VDR utility 110, and which are specific to the invention, are: (a) code/logic for creating a netlist data structure for an initial electronic design; (b) code/logic for determining a first set of target signatures of the initial netlist data structure for a first verification run; (c) code/logic for comparing a first set of target signatures for the first verification run with a second set of target signatures for a subsequent verification run, respectively; and (d) code/logic for re-using verification results from the first verification run, when a functional match of a first target of the first verification run and a second target of the subsequent verification run is identified. According to the illustrative embodiment, when CPU 101 executes VDR utility 110, DPS 100 initiates a series of functional processes that enable the above functional features as well as additional features/functionality. These features/functionality are described in greater detail below within the description of FIGS. 2-7.

Those of ordinary skill in the art will appreciate that the hardware components and basic configuration depicted in FIG. 1 may vary. The illustrative components within DPS 100 are not intended to be exhaustive, but rather are representative to highlight essential components that are utilized to implement the present invention. For example, other devices/components may be used in addition to or in place of the hardware depicted. The depicted example is not meant to imply architectural or other limitations with respect to the presently described embodiments and/or the general invention. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

Figure 2:
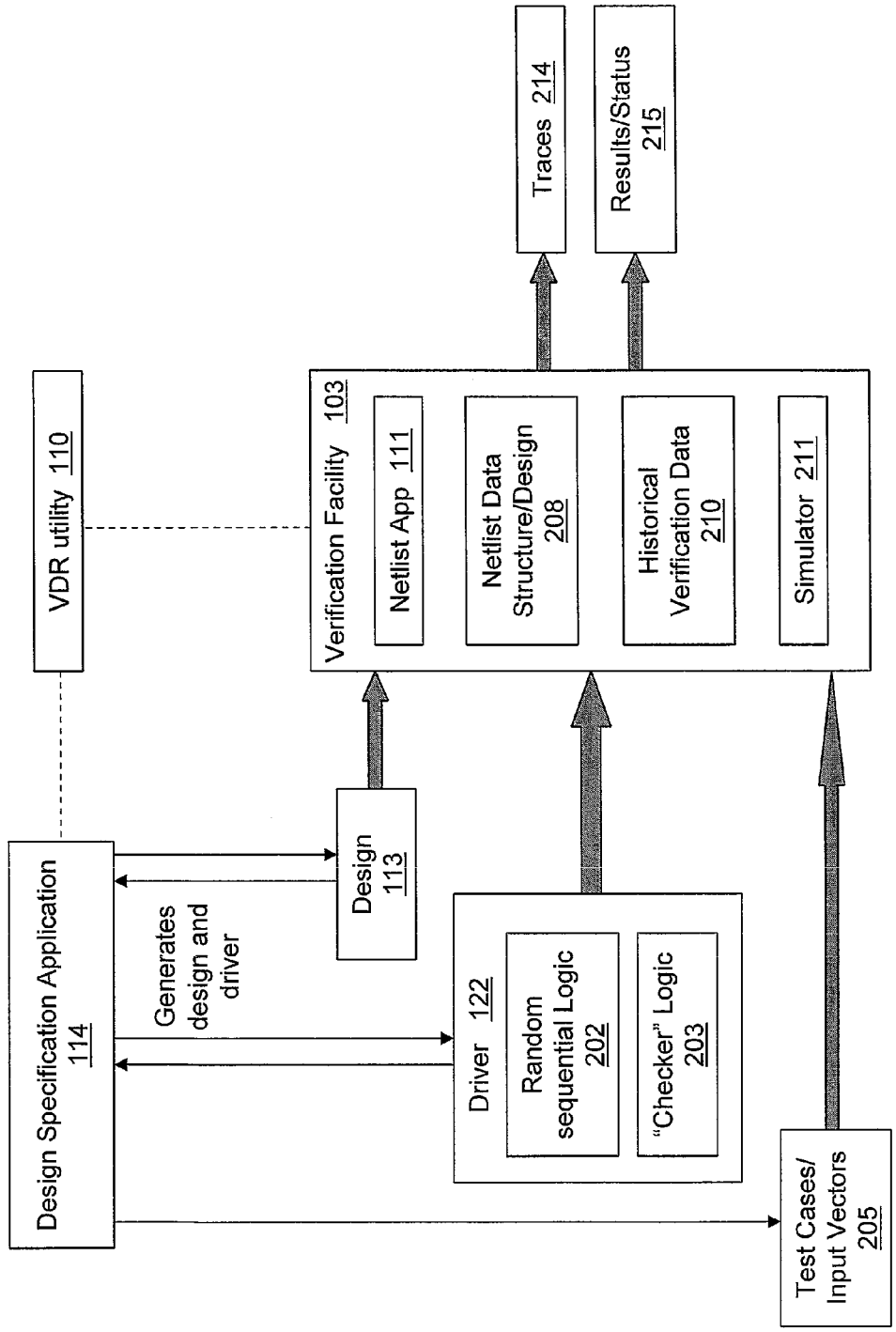
FIG. 2 illustrates a design and verification flow, according to one embodiment.

With reference now to FIG. 2, a design and verification flow is illustrated, according to one embodiment. Flow 200 comprises Design Specification Application (DSA) 114. DSA 114 facilitates the generation of design 113, driver 122 and Test cases 205. Driver 122 comprises random sequential logic 202 and checker logic 203. Flow 200 also comprises verification facility 103. Verification facility 103 further comprises Netlist Application 207, Netlist Design 208 and Historical verification data 210. Verification facility 103 also comprises. Simulator 211. Verification facility 103 yields Trace(s) 214 and Results/Status 215. Also illustrated in flow 200 is VDR utility 110.

In flow 200, a user/designer creates/specifies an electrical circuit design 113 via DSA 114. DSA 114 may be an application based on a hardware description language such as VHDL or Verilog. Using DSA 114, a user also defines "driver" 122 for design 113. Driver 122 is "composed onto the inputs" of design 113, i.e., driver 122 is used to filter illegal stimulus to design 113. Given a design (e.g., design 113) with N primary inputs, there are 2^N distinct possible input vectors that may be applied to design 113 at any time. A simulation "test case" of length "M" executed via simulator 211 comprises M distinct input vectors (e.g., test cases 205), for a total of 2^(M*N) (i.e., 2 raised to the power of M×N) distinct possibilities. Many cases of test cases 205 may be designated as "illegal" since these illegal test cases may attempt to exercise design 113 in a fashion in which a true hardware system containing design 113 is incapable. Furthermore, design 113 is not expected to function properly when these illegal test cases are used. Driver 122 thus comprises logic that filters illegal vectors, and illegal sequences of vectors, random sequential logic 202. In addition, a set of correctness properties is defined for design 113 in the form of "checker" logic 203 that is also composed onto the design/driver composition. Furthermore, VDR utility 110 may utilize checker/monitor logic 203 which monitors design behavior over time. In particular, VDR utility 110 utilizes checker logic 203 to initiate the checking equivalence of outputs. In an equivalence-checking problem, outputs (i.e., cone-of-logic sinks) are checked across design models (i.e., compared for a first/old design and a second/new design). In order to verify that corresponding outputs of the first and second design have identical functionality, an XOR operation is performed on the corresponding outputs. The result of the XOR operation provides an answer to a "problem" that is mathematically solved. By performing a number of XOR operations, VDR utility 110 determines whether it is possible to get a '1' at the XOR output. If a "1" is obtainable, a particular sequence of input vectors may yield an unequal set of corresponding outputs and the equivalence check fails. An equivalence check job involves checking one design against another by creating many of these "problems" from corresponding outputs and solving all the problems. In addition, VDR utility 110 may determine design behavior by using output/CHECKSTOP signals. For example, if design 113 is observed to behave improperly, the monitor logic may assert (i.e., drive to a logical '1') a CHECKSTOP signal. Output signals, including CHECKSTOP signals which are contained within a broader class of checker signals, are referred to as "targets".

Targets may either be "fail" targets or "cover" targets. "Fail targets" are used to assess functional correctness of design 113 via the output/CHECKSTOP signal, while "cover" or "coverage targets" are expected to be assertable and serve as a metric against which to measure the quality of possibly incomplete verification efforts. The functional verification task is thus to assess whether such targets can be asserted on the design/driver composition or not. If these targets can be asserted, a "trace" (e.g., trace 214) may be generated for debug purposes showing how such an assertion of the target may occur.

In one embodiment, VDR utility 110 creates a netlist representation (e.g., netlist data structure 208) of design 113 via verification facility 103. Thus, a verification problem defined via verification facility 103 includes a netlist or another appropriate representation of a circuit structure and a set of expected values at one or more of the circuit's nets that are to be proven or disproven. A netlist graph is a compact means of representing logic problems derived from circuit structures in the computer-aided design of digital circuits. Netlist data structure 208 contains a directed graph with vertices representing gates, and edges representing interconnections between those gates. Certain gates in the netlist may be labeled as "primary outputs", "targets", "constraints", etc; the targets and outputs are the points of interest for the purposes of functional verification and correspondence checking. A target in the functional verification context and an output equivalence check in the context of correspondence checking, are, herein, both referred to as targets.

Referring again to FIG. 2, when a new (logic) problem is invoked, verification facility 103 imports design 113 into an internal netlist data structures using netlist application 111. As a first step, VDR utility 110 inspects the netlist description on a target-by-target basis via a cone-of-influence (COI) reduction and computes a unique signature (e.g., a Cyclic Redundancy Check code (CRC) or a Message Digest algorithm 5 (MD5) hash code) to represent the structural "construction" of the target. A COI reduction is a technique for reducing the size of models used in symbolic model checking. In addition, VDR utility 110 records the signature in a database. A verification run may have a large number of targets to be solved, especially when performing a combinational equivalence check that may be decomposed into a large number of sub-checks. These sub-checks are performed in order to verify equivalence of next-state functions of state elements by inserting "cutpoints" at the state elements. Once a verification run terminates, each of the targets has one of the following status (illustrated by output status/results 215): (1) the target is proven unreachable and cannot be hit in the reachable state of the design; (2) the target is hit, producing a trace showing a sequence of valuations to the inputs and internal signals depicting the hit; or (3) the target is unsolved. When the target is unsolved or unreachable, VDR utility 110 provides additional relevant data obtained as a result of a verification run, including (a) number of simulation cycles run, or (b) number of steps from the initial state for which the targets cannot be hit. VDR utility 110 archives all of the verification data with the problem definition and the computed signatures.

When the design under test is changed for any of a number of reasons including, for example, a timing issue, to fix a bug or to address power issues, VDR utility 110 initiates a process to again verify correct functionality. In order to perform a current verification of a design, VDR utility 110 inspects the netlist description on a target-by-target basis to compute the current signatures of the design, based on input data associated with the current verification run, and compares these current signatures to the archived signatures retrieved from historical verification data 210. The targets for which the signatures are substantially identical indicate that there is no change in the corresponding functionally since the last time the problem was run. Therefore, the current verification run target problems may be identified by the matching signatures and associated archived results/"answers" from historical verification data 210. Thus, VDR utility 110 reuses historical verification data 210 to avoid the execution of an explicit expensive functional formal check. An additional benefit is that for targets that were hit in the past and are unchanged, the existing counterexample trace may be reused.

In one embodiment, VDR utility 110 may initiate various other checks such as bill-of-materials checks used to indicate whether input files to a run have changed or not. The embodiment is easily able to handle minor changes to the text files (e.g., HDL files) describing the problems via an inherent ability to normalize minor changes to the design, and allows reuse of results, thus saving exponential time and resources. In practical industrial settings, the embodiment provides substantial benefits in the form of orders of magnitude speed-ups (and memory savings), leveraging the fact that typical changes to a design are incremental in nature that are localized to only portions of the design. The benefits are even more pronounced in combinational Boolean equivalence checking where, due to the nature of the verification, the task is broken into smaller tasks. As a consequence, a redesign of a portion of the design does not necessarily impact the other sub-problems.

Figure 3:
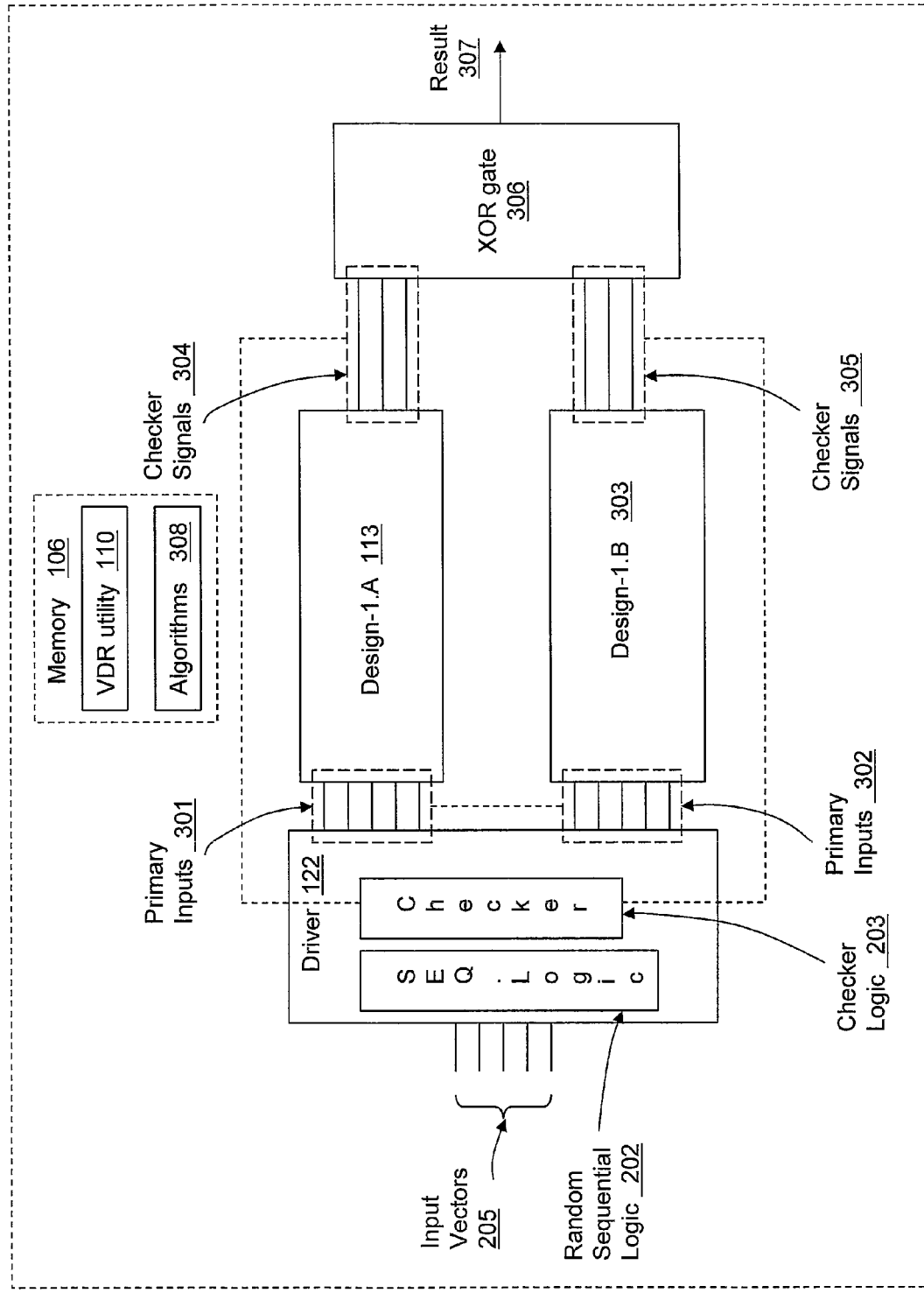
FIG. 3 is a block diagram illustrating a circuit that enables correspondence checking, according to one embodiment.

FIG. 3 is a block diagram representation of circuitry that enables correspondence checking, according to one embodiment of the invention. Circuit 300 comprises driver 122 that receives input vectors 205. Driver 122 further comprises random sequential logic 202 and checker logic 203. Circuit 300 also comprises first design 113 and second design 303. First design 113 and second design 303 respectively receive an identical set of primary input signals via primary-1 301 and primary-2 302. In addition, circuit 300 comprises XOR gate 306. XOR gate 306 receives first checker signal(s) 304 and second checker signal(s) 305 from first design 113 and second design 303, respectively. XOR gate 306 yields output signal 307. Also illustrated within circuit 300 are VDR utility 110 and Correspondence Checking Algorithm 308, both located within memory 106.

Circuit 300 is composed of both a previous/initial design and a current/modified design. Driver 122 filters input vectors 205 to ensure that only legal inputs (e.g., first primary inputs 301 and second primary inputs 302) are applied to initial design 113 and modified design 303. In circuit 300, corresponding inputs of both designs are connected together to ensure that the same stimulus applied to an initial design segment in the composite model is also applied to the modified design segment. VDR utility 110 identifies the corresponding output/CHECKSTOP signal (e,g., first checker signal(s) 304 and second checker signal(s) 305) in both the previous and the current design and builds a new verification task in the composite design representing the exclusive-OR (XOR) of the previous and current output/CHECKSTOP signals. In other words, VDR utility 110 compares the previous and current output/CHECKSTOP signals via the XOR operation via XOR gate 306 in the composite design of circuit 300. If the result (e.g., result 307) of the XOR operation may be asserted in the composite design of circuit 300, result 307 signifies that the previous and current designs have changed in functionality with respect to the output/CHECKSTOP signal, or that the correspondence of inputs or targets is incorrect. If the XOR may not ever be asserted, as indicated by result 307, then VDR utility 110 determines that the previous and current output/CHECKSTOP signals have identical functionality.

Figure 4:
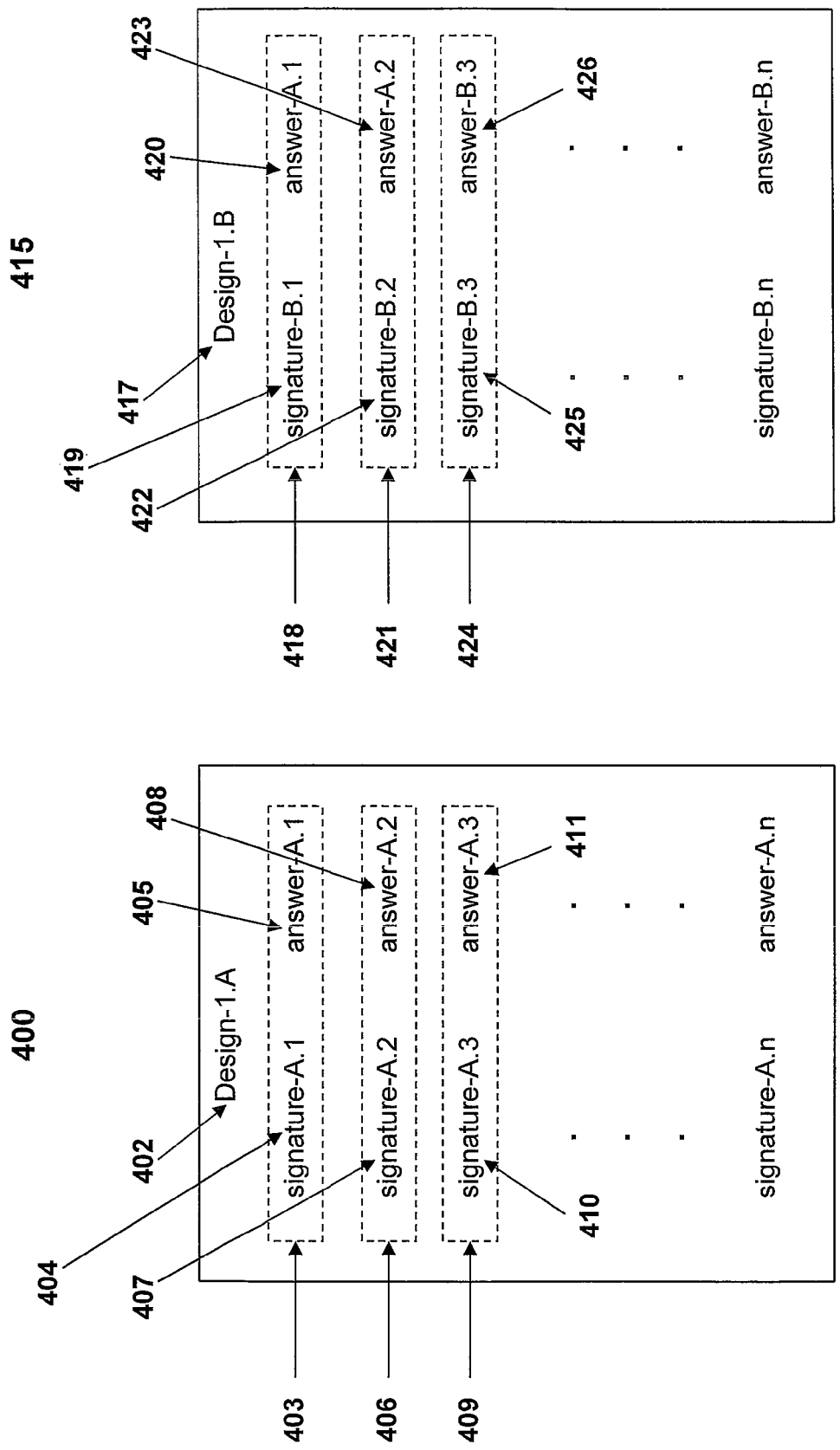
FIG. 4 depicts a pair of example files illustrating problem signatures and answers corresponding to an initial design and a modified design, according to one embodiment.

FIG. 4 depicts a pair of example files illustrating problem signatures and answers corresponding to an initial/first design run and a modified/second design run, according to one embodiment. In particular, FIG. 4 comprises problem-signature and answer files illustrated as first file 400 and second file 415. First file 400 contains multiple entries for a first design run referred to by "Design-1.A" 402. First entry-A 403 comprises first signature-A.1 404 and corresponding first answer-A.1 405. Second entry-A 406 comprises second signature-A.2 407 and corresponding second answer-A.2 408. Third entry-A 409 comprises third signature-A.3 410 and corresponding third answer-A.3 411. Similarly, second file 415 contains multiple entries for a second design run referred to by "Design-1.B" 417. First entry-B 418 comprises first signature-B.1 419 and corresponding first answer-A.1 420. Second entry-B 421 comprises second signature-B.2 422 and corresponding second answer-A.2 423. Third entry-B 424 comprises third signature-B.3 425 and corresponding third answer-B.3 426.

VDR utility 110 creates a unique signature to represent a structural problem definition of a corresponding target. In one embodiment, the unique signatures are maximal-length-bounded digests which represent a class of codes which includes: (a) Message-Digest algorithm 5 (MD5) hash codes; and (b) Cyclic Redundancy Check (CRC) codes. VDR utility 110 applies a cone of influence (COI) procedure to identify targets within a netlist design description.

During correspondence checking, VDR utility 110 compares the signatures for a set of logic problems for a first run of a design (e.g., Design-1.A) and a second run of a same design (e.g., Design-1.B). In one embodiment, the first run and second run may represent a set or subset of tests, using different test vectors, that are to be performed on a single design in order to perform a thorough verification of one or more functions. In a job/run (i.e., execution of the verification program), either for single-model-property-checking or multiple-model-equivalence-checking, VDR utility 110 utilizes the design model in single-model-property checking or multiple models in equivalence-checking to create "problems". These "problems" comprise either output/CHECKSTOP signal problems or XOR problems that are mathematically solved to create a result/answer. VDR utility 110 generates one pass/fail result per "problem". Furthermore, VDR utility 110 generates an overall result per job. For example, if all results per "problem" are successful, the overall job is successful and "passes". The overall job "fails" otherwise. VDR utility 110 creates, for each problem, one signature which describes the problem. VDR utility 110 inspects data from a previous job to determine whether a matching signature exists for corresponding problem signature of a current run. A matching signature indicates that the "problem" is already solved and the corresponding answer is available. If a matching signature is identified, VDR utility 110 re-uses the answer without performing resource intensive operations to re-solve the mathematical problem. In particular, VDR utility 110 compares a first signature corresponding to the first run of the design illustrated by signature-A.1 404 and a second signature of the second run of the design illustrated by signature-B.1 419, for a sequence of input vectors. Based on the comparison, VDR utility 110 determines that signature-A.1 A.1 404 matches signature-B.1 419. As a result, VDR utility 110 determines that the targets associated with the signatures have identical functionality. Therefore, VDR utility 110 maps first answer-A.1 405 corresponding to signature-A.1 404 to signature-B.1 419 as illustrated by second answer-A.1 420. In addition, VDR utility 110 compares signature-A.2 407 and signature-B.2 422 and determines that signature-A.2 407 matches signature-B.2 422. Thus, VDR utility 110 determines that the targets associated with the signatures have identical functionality. Therefore, VDR utility 110 maps first answer-A.2 408 corresponding to signature-A.2 407 to signature-B.2 422 as illustrated by second answer-A.2 423. VDR utility 110 also compares signature-A.3 410 and signature-B.3 425 and determines that signature-A.3 410 and signature-B.3 425 do not constitute a match. Thus, VDR utility 110 determines that the targets have dissimilar functionality. Therefore, VDR utility 110 is unable to apply answer-A.3 411, corresponding to signature-A.3 410, to signature-B.3 425. As a result, VDR utility provides answer-B.3 426 for signature-B.3 425 by a full verification of the target.

Figure 5:
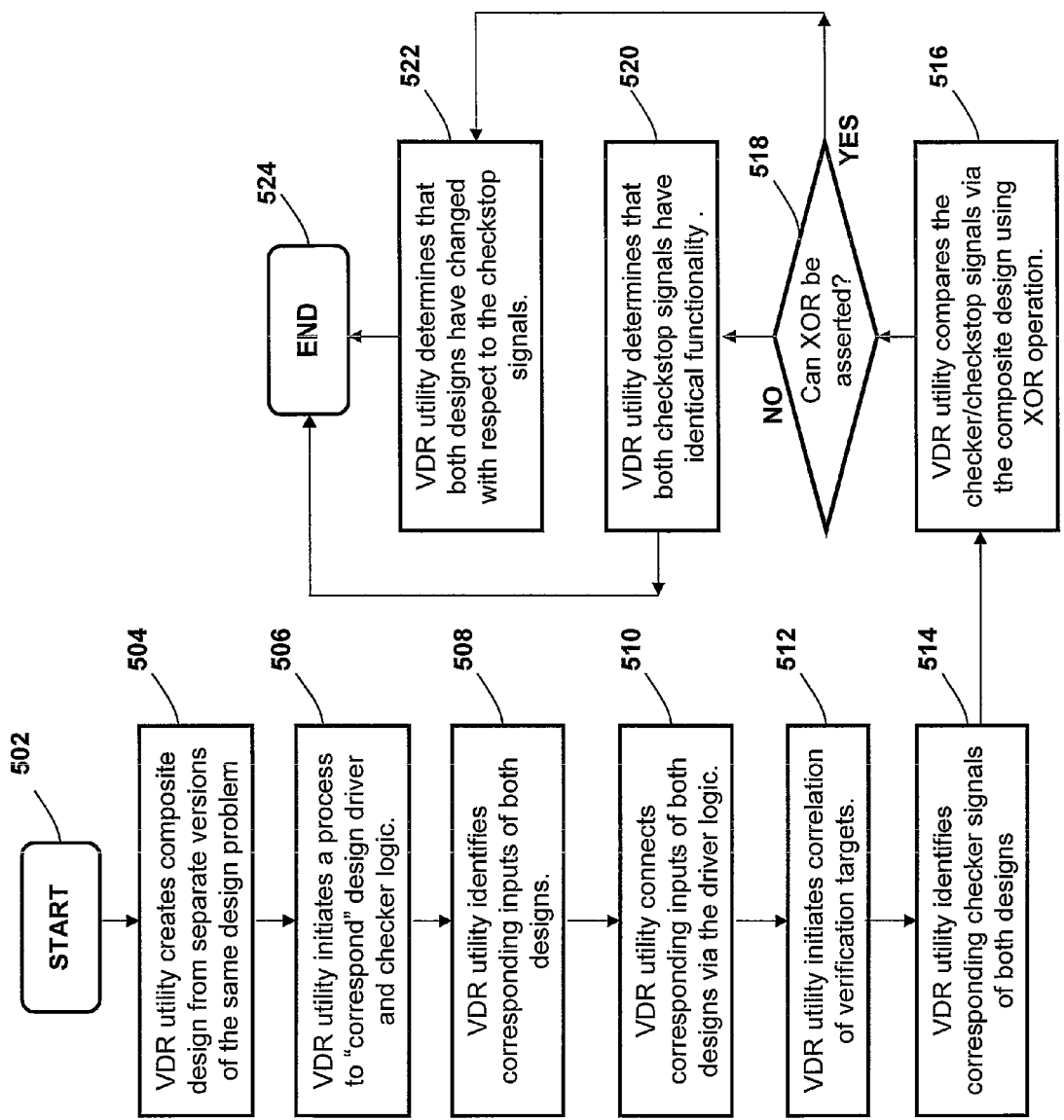
FIG. 5 is a flow chart illustrating the method of correspondence checking, according to one embodiment of the invention.
Figure 6:
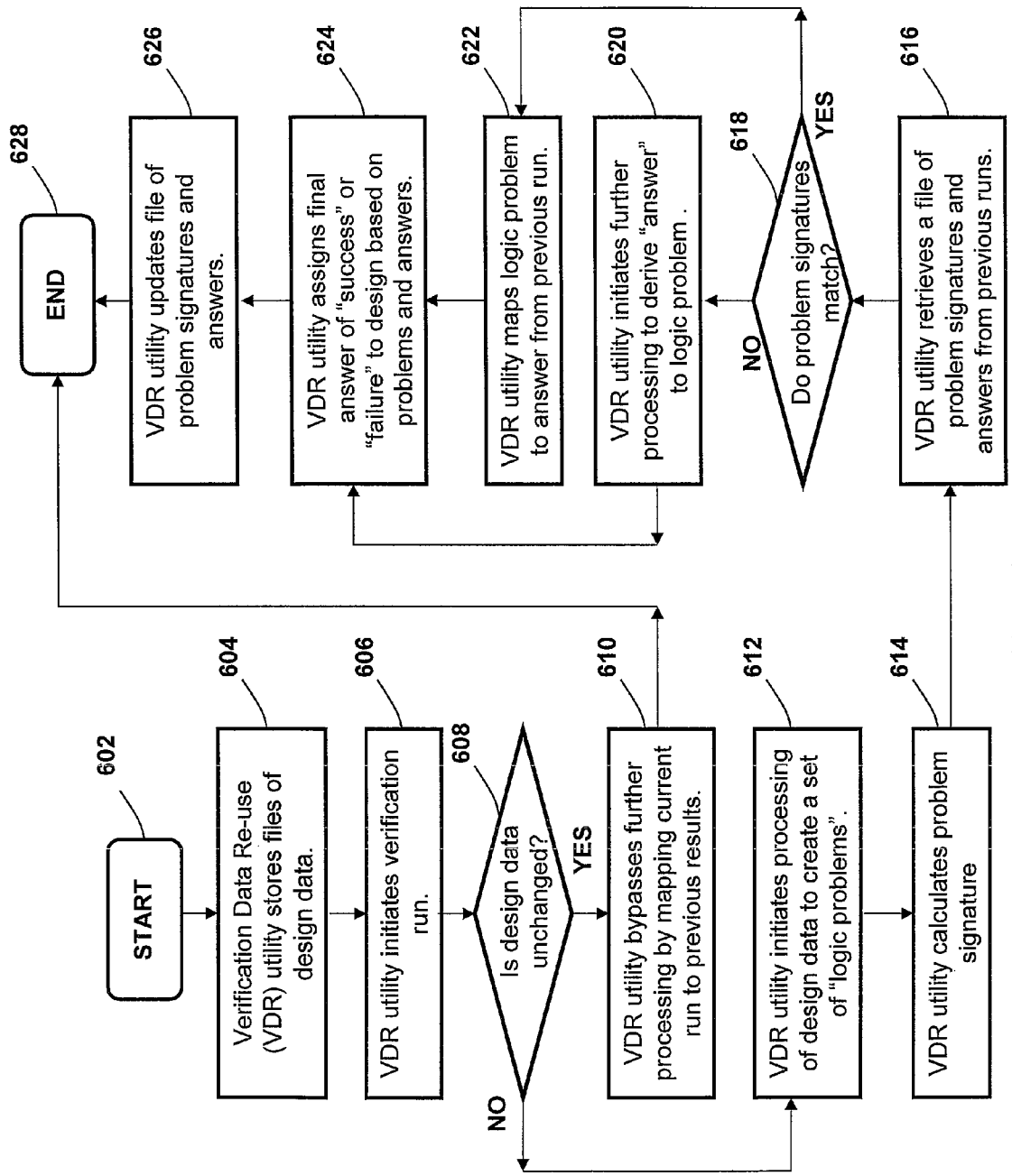
FIG. 6 is a flow chart illustrating the process of creating a set of logic problems and obtaining the corresponding answers to the logic problems, according to one embodiment.
Figure 7:
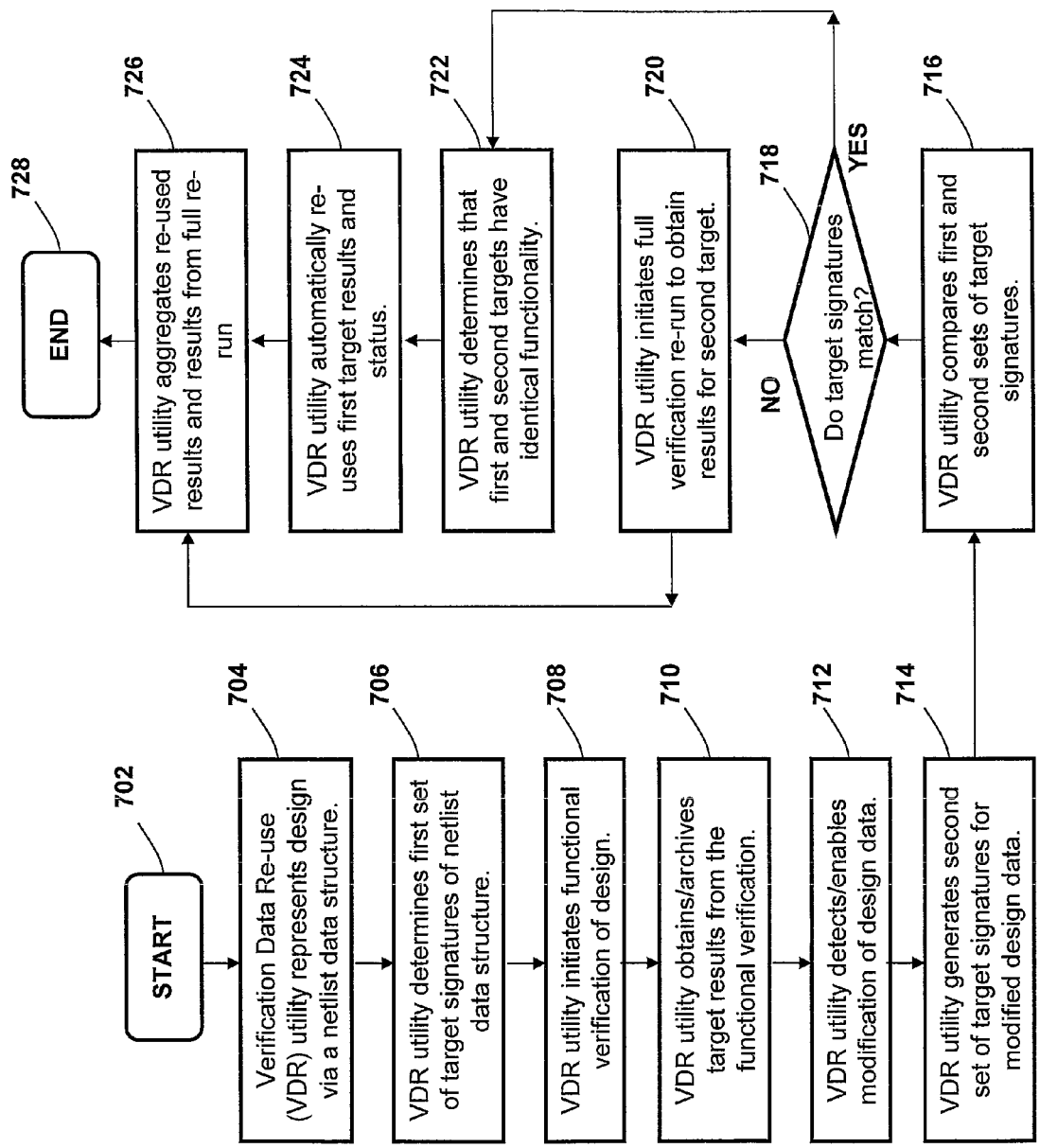
FIG. 7 is a flow chart illustrating the process of re-using historical verification data during the verification of a circuit design, according to one embodiment of the invention.

FIGS. 5-7 are flow charts illustrating various methods by which the above processes of the illustrative embodiments are completed. In particular, FIG. 5 illustrates the method of correspondence checking. Although the methods illustrated in FIGS. 5-7 may be described with reference to components shown in FIGS. 1-4, it should be understood that this is merely for convenience and alternative components and/or configurations thereof can be employed when implementing the various methods. Key portions of the methods may be completed by VDR utility 110 executing on processor 101 within DPS 100 (FIG. 1) and controlling specific operations of/on DPS 100, and the methods are thus described from the perspective of either/both VDR utility 110 and DPS 100.

The process of FIG. 5 begins at initiator block 502 and proceeds to block 504, at which VDR utility 110 creates a composite circuit design that is composed of both a previous design version and a current design version. At block 506, VDR utility 110 initiates a process to correspond the design driver and checker logic. In other words, VDR utility 110 employs the driver logic to provide identical stimuli/inputs to both versions of the design. In order to correspond the driver logic, one correlates the inputs to the previous and current designs; i.e., for each input to previous, VDR utility 110 identifies the corresponding input to current, as shown at block 508. At block 510, VDR utility 110 connects the corresponding inputs of both designs together to ensure that the same stimulus applied to the previous design copy in the composite model is also applied to the current design copy. Note that "input correlation" refers to correlating any random nets in the driver which in turn drive the primary inputs to the design, not necessarily the primary inputs themselves - which may no longer be truly random due to the driver logic. At block 512, VDR utility 110 initiates a process to correlate the verification "targets". In order to correlate the verification targets, VDR utility 110 identifies the corresponding output/CHECKSTOP signal in both the previous and the current design, as shown at block 514. At block 516, VDR utility 110 builds a new verification task in the composite design representing the exclusive-OR (XOR) of the previous and current output/CHECKSTOP signals. In other words, VDR utility 110 compares the previous and current output/CHECKSTOP signals via the XOR operation in the composite design. At decision block 518, VDR utility 110 determines whether a value of "1" may be asserted by the XOR operation. If at block 518 VDR utility 110 determines that the value "1" may not ever be asserted by the XOR operation in the design, then VDR utility 110 determines that the previous and current output/CHECKSTOP signals have identical functionality, as shown at block 520. If VDR utility 110 determines that the value "1" may be asserted by the XOR operation in the design, VDR utility 110 also determines that the previous and current designs have changed in functionality with respect to the output/CHECKSTOP signal, or that the correspondence of inputs or targets is incorrect, as shown at block 522.

In one embodiment, because the correspondence model of circuit 300 (FIG. 3) is approximately twice as large as either the previous or current copy of the design, the correspondence check may in some cases be much more computationally expensive to solve than the problems involving output/CHECKSTOP signals in either the previous or current design alone. However, if the previous and current designs are very similar, VDR utility 110 utilizes a variety of advanced correspondence checking algorithms (e.g., combinational equivalence checking algorithms) to very efficiently discharge the verification problem, regardless of the size of the previous and current designs.

One embodiment of correspondence checking is Boolean equivalence checking, in which the initial/previous and current/modified designs have the same state encoding and verification checks equivalence of the outputs and internal state points. As a result, both designs are ensured of equivalent input-output behavior for all possible initial states. In this embodiment, the overall check for equivalence is decomposed into smaller combinational checks of cones of logic feeding the next-state functions of the state elements and the outputs. By virtue of treating internal state points as "cut-points", the problem decomposition is modeled as a piecewise check of equivalence of the combinational logic spanning between the state elements. The problem decomposition dramatically simplifies the check. However, this method of problem decomposition imposes a restriction on the design process that much ensures the same state encoding in both designs and results in a large number of problems to be solved. Hence, computational complexity of the equivalence check is traded with sheer number of checks and related book-keeping. The process illustrated by the flow chart of FIG. 5 ends at block 524.

The flow chart of FIG. 6 illustrates the process of creating a set of logic problems and obtaining the corresponding answers to the logic problems. The process of FIG. 6 begins at initiator block 602 and proceeds to block 604, at which VDR utility 110 stores files of data for a circuit design. At block 606, VDR utility 110 initiates verification of circuit design. At decision block 608, VDR utility 110 determines whether the file(s) of data that for the design that was previously verified has been modified. If at decision block 608, VDR utility 110 determines that the file(s) of design data have been modified, VDR utility 110 bypasses further processing by indicating that the verification results have been previously completed, as shown at block 610. If at decision block 608, VDR utility 110 determines that the design data has been modified, VDR utility 110 initiates processing of the modified design data to create a set of logic problems, as shown at block 612. At block 614, VDR utility 110 initiates a process to obtain an answer for the logic problems by calculating the corresponding problem signatures. At block 616, VDR utility 110 retrieves a file of problem signatures and answers from a previous run. At decision block 618, VDR utility 110 determines whether the problem signatures of the modified design data match the archived problem signatures. In one embodiment, VDR utility 110 compares a target signature from the first set of target signatures with the corresponding target signature from the second set of target signatures. The number of comparisons performed is based upon the number of target signatures corresponding to the design data. If at block 618 VDR utility 110 determines that the problem signatures of the modified design data do match the archived problem signatures, VDR utility 110 maps the logic problem of the modified design data to the corresponding answer from a previous verification run, as shown at block 622. However, if VDR utility 110 determines that the problem signatures of the modified design data do not match the archived problem signatures, VDR utility 110 initiates further processing to derive an answer to the logic problem of the modified design data, as shown at block 620. At block 624, VDR utility 110 assigns a conclusive answer of "success" or "failure" to the modified design data based on the problems and answers. At block 626, VDR utility 110 updates the file of problem signatures and answers for the modified design data. The process ends at block 628.

The flow chart of FIG. 7 illustrates the process of re-using historical verification data during the verification of a circuit design. The process of FIG. 7 begins at initiator block 702 and proceeds to block 704, at which VDR utility 110 creates a netlist data structure as a representation of an electrical circuit design. At block 706, VDR utility 110 determines a first set of target signatures of the netlist data structure or of the initial design data. VDR utility 110 initiates a functional verification run of the electrical circuit design, as shown at block 708. At block 710, VDR utility 110 obtains/archives target results from the verification run. VDR utility 110 subsequently enables/detects the modification of the design data, as shown at block 712. At block 714, VDR utility 110 determines a second set of target signatures corresponding to the modified design data. VDR utility 110 initiates a comparison of the (previously archived) first target signatures and the second target signatures, as shown at block 716.

At decision block 718, VDR utility 110 determines whether the first set of target signature match the second set of target signatures. If at block 720 VDR utility 110 determines that a first target signature from the first set of target signatures does not match a second target signature from the second set of target signatures, VDR utility 110 initiates a verification run to obtain results for the second target signature, as shown at block 720. However, if VDR utility 110 determines that the first target signature matches the second target signature, VDR utility 110 determines that the first and second targets have identical functionality, as shown at block 722. At block 724, VDR utility 110 applies first target results to the modified design data. At block 726, VDR utility 110 aggregates (a) the re-usable results and (b) the results that are generated from a full verification re-run, in order to complete the functional verification of the design. The process ends at block 728.

In the flow charts above, one or more of the methods are embodied in a computer readable medium containing computer readable code such that a series of steps are performed when the computer readable code is executed (by a processing unit) on a computing device. In some implementations, certain processes of the methods are combined, performed simultaneously or in a different order, or perhaps omitted, without deviating from the spirit and scope of the invention. Thus, while the method processes are described and illustrated in a particular sequence, use of a specific sequence of processes is not meant to imply any limitations on the invention. Changes may be made with regards to the sequence of processes without departing from the spirit or scope of the present invention. Use of a particular sequence is therefore, not to be taken in a limiting sense, and the scope of the present invention extends to the appended claims and equivalents thereof.

As will be appreciated by one skilled in the art, the present invention may be embodied as a method, system, and/or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," "logic", or "system." Furthermore, the present invention may take the form of a computer program product on a computer-usable storage medium having computer-usable program code embodied in or on the medium.

As will be further appreciated, the processes in embodiments of the present invention may be implemented using any combination of software, firmware, microcode, or hardware. As a preparatory step to practicing the invention in software, the programming code (whether software or firmware) will typically be stored in one or more machine readable storage mediums such as fixed (hard) drives, diskettes, magnetic disks, optical disks, magnetic tape, semiconductor memories such as RAMs, ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The medium may be electronic, magnetic, optical, electromagnetic, infrared, or semiconductor system (or apparatus or device) or a propagation medium. Further, the medium may be any apparatus that may contain, store, communicate, propagate, or transport the program for use by or in connection with the execution system, apparatus, or device. The methods of the invention may be practiced by combining one or more machine-readable storage devices containing the code according to the described embodiment(s) with appropriate processing hardware to execute the code contained therein. An apparatus for practicing the invention could be one or more processing devices and storage systems containing or having network access (via servers) to program(s) coded in accordance with the invention. In general, the term computer, computer system, or data processing system can be broadly defined to encompass any device having a processor (or processing unit) which executes instructions/code from a memory medium.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non exclusive list of types of media, includes recordable type (tangible) media such as floppy disks, thumb drives, hard disk drives, CD ROMs, DVDs, and transmission type media such as digital and analogue communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method comprising:
    developing a first electrical circuit design;
    creating a netlist data structure as a representation of the first electrical circuit design;
    generating a first set of target signatures of the netlist data structure or first electrical circuit design for a first verification run, according to a first set of input vectors;
    executing the first functional verification run for the first electrical circuit design;
    obtaining a status of one or more first targets from the first functional verification run;
    wherein said status of the one or more first targets represents a first set of outputs from the first verification run of the first electrical circuit design;
    modifying the first electrical circuit design;
    providing a modified netlist data structure for the modified first electrical circuit design;
    initiating a second functional verification run for the first electrical circuit design;
    generating a second set of target signatures of the first netlist data structure or first electrical circuit design, according to a second set of input vectors;
    determining whether a first set of target signatures are substantially identical to a second set of target signatures, respectively;
    when a first target signature is substantially identical to a second target signature, determining that a first target and a second target have a substantially identical functionality; and
    when a first target and a second target have the substantially identical functionality, re-using verification results associated with a corresponding first target to eliminate a formal verification re-run associated with the second target;
    performing an initial functional verification run for the modified first electrical circuit design;
    obtaining a second set of outputs from the initial functional verification run for the modified first electrical circuit design; and
    comparing a first set of outputs with a second set of outputs, respectively.

2. The method of claim 1, wherein said generating further comprises:
    identifying one or more design targets based on a cone of influence (COI) procedure;
    creating a unique signature to represent a structural construction of a corresponding target, wherein said signature is a maximal-length-bounded digest;
    wherein said maximal-length-bounded digest represents a class of codes which includes:
    (a) Message-Digest algorithm 5 (MD5) hash codes; and (b) Cyclic Redundancy Check (CRC) codes; and
    determining when a second set of design data used to generate a second set of target signatures represents a change from the first set of design data used to generate a first set of target signatures by a utilization of a timestamp check.

3. The method of claim 1, wherein said comparing further comprises:
    creating a composite design using the first electrical circuit design and the modified first electrical circuit design;
    identifying a first set of inputs of the first electrical circuit design that correspond to a second set of inputs to the modified first electrical circuit design;
    connecting the first set of inputs of the first electrical circuit design that correspond to the second set of inputs to the modified first electrical circuit design;
    applying a sequence of vectors to the first electrical circuit design and the modified first electrical circuit design, wherein said sequence of vectors represents a complete and allowable set of primary inputs;
    detecting a first output signal of the first electrical circuit design and a second output signal of the modified first electrical circuit design, wherein said first output signal and said second output signal correspond to particular verification target;
    comparing the first output signal and the second output signal corresponding to the sequence of vectors;
    when the first output signal and the corresponding second output signal are substantially identical for a full duration of the sequence of vectors, determining that the first electrical circuit design and the modified first electrical circuit design have a substantially identical functionality associated with the particular verification target;
    when the first output signal and the corresponding second output signal are dissimilar for a segment of the sequence of vectors, determining that the first electrical circuit design and the modified first electrical circuit design have a dissimilar functionality associated with the particular verification target; and
    enabling generation of an output trace to depict a sequence of inputs and internal signals that produce a disparity between the first output signal and the second output signal.

4. The method of claim 1, wherein said developing further comprises:
    creating a driver for one or more of the first electrical circuit design and the modified first electrical circuit design;
    developing random sequential logic for the driver to control inputs to the first electrical circuit design or modified design;
    filtering inputs to the first electrical circuit design or the modified first electrical circuit design to prevent illegal vectors or sequences of vectors from being applied to the inputs of the first electrical circuit design or the modified first electrical circuit design, by using the driver;
    providing checker logic for the driver to enable said driver to monitor design behavior via output signals including checker signals for specific intervals of time;
    indicating a status of a target based on a checker signal, wherein said status indicates one of: (a) the target is unreachable based on a current state of design; (b) the target is reachable; or (c) the target is unsolved;
    wherein said checker signals include checkstop signals;
    generating an output trace to depict a sequence of inputs and internal signals that produce a reachable target; and
    when the target is unsolved or unreachable, providing additional relevant data obtained as a result of a verification run, including (a) number of simulation cycles run, or (b) number of steps from the initial state for which the targets cannot be hit.

5. The method of claim 3, wherein said comparing further comprises:
    performing exclusive OR operations between the first set of output signals representing the first electrical circuit design and a second set of output signals representing the modified first electrical circuit design.

6. The method of claim 3, further comprising:
    applying a correspondence checking algorithm to the composite design to provide a faster and more efficient comparison of the first electrical circuit design and the modified first electrical circuit design.

7. A data processing system comprising:
one or more processors;
a memory system;
program code which when executed on the processor provides the functions of:
developing a first electrical circuit design;
creating a netlist data structure as a representation of the first electrical circuit design;
generating a first set of target signatures of the netlist data structure or first electrical circuit design for a first verification run, according to a first set of input vectors;
executing the first functional verification run for the first electrical circuit design;
obtaining a status of one or more first targets from the first functional verification run;
wherein said status of the one or more first targets represents a first set of outputs from the first verification run of the first electrical circuit design;
modifying the first electrical circuit design;
providing a modified netlist data structure for the modified first electrical circuit design;
initiating a second functional verification run for the first electrical circuit design;
generating a second set of target signatures of the first netlist data structure or first electrical circuit design, according to a second set of input vectors;
determining whether a first set of target signatures are substantially identical to a second set of target signatures, respectively;
when a first target signature is substantially identical to a second target signature, determining that a first target and a second target have a substantially identical functionality; and
when a first target and a second target have the substantially identical functionality, re-using verification results associated with a corresponding first target to eliminate a formal verification re-run associated with the second target;
performing an initial functional verification run for the modified first electrical circuit design;
obtaining a second set of outputs from the initial functional verification run for the modified first electrical circuit design; and
comparing a first set of outputs with a second set of outputs, respectively.

8. The data processing system of claim 7, wherein said functions for generating further comprises functions for:
identifying one or more design targets based on a cone of influence (COI) procedure;
creating a unique signature to represent a structural construction of a corresponding target, wherein said signature is a maximal-length-bounded digest;
wherein said maximal-length-bounded digest represents a class of codes which includes:
(a) Message-Digest algorithm 5 (MD5) hash codes; and (b) Cyclic Redundancy Check (CRC) codes; and
determining when a second set of design data used to generate a second set of target signatures represents a change from the first set of design data used to generate a first set of target signatures by a utilization of a time-stamp check.

9. The data processing system of claim 7, wherein said functions for comparing further comprises functions for:
creating a composite design using the first electrical circuit design and the modified first electrical circuit design;
identifying a first set of inputs of the first electrical circuit design that correspond to a second set of inputs to the modified first electrical circuit design;
connecting the first set of inputs of the first electrical circuit design that correspond to the second set of inputs to the modified first electrical circuit design;
applying a sequence of vectors to the first electrical circuit design and the modified first electrical circuit design, wherein said sequence of vectors represents a complete and allowable set of primary inputs;
detecting a first output signal of the first electrical circuit design and a second output signal of the the modified first electrical circuit design, wherein said first output signal and said second output signal correspond to particular verification target;
comparing the first output signal and the second output signal corresponding to the sequence of vectors;
when the first output signal and the corresponding second output signal are substantially identical for a full duration of the sequence of vectors, determining that the first electrical circuit design and the the modified first electrical circuit design have a substantially identical functionality associated with the particular verification target;
when the first output signal and the corresponding second output signal are dissimilar for a segment of the sequence of vectors, determining that the first electrical circuit design and the modified first electrical circuit design have a dissimilar functionality associated with the particular verification target; and
enabling generation of an output trace to depict a sequence of inputs and internal signals that produce a disparity between the first output signal and the second output signal.

10. The data processing system of claim 7, wherein said functions for developing further comprises functions for:
creating a driver for one or more of the first electrical circuit design and the modified first electrical circuit design;
developing random sequential logic for the driver to control inputs to the first electrical circuit design or the modified first electrical circuit design;
filtering inputs to the first electrical circuit design or the modified first electrical circuit design to prevent illegal vectors or sequences of vectors from being applied to the inputs of the first electrical circuit design or the modified first electrical circuit design, by using the driver;
providing checker logic for the driver to enable said driver to monitor design behavior via output signals including checker signals for specific intervals of time;
indicating a status of a target based on a checker signal, wherein said status indicates one of: (a) the target is unreachable based on a current state of design; (b) the target is reachable; or (c) the target is unsolved;
wherein said checker signals include checkstop signals;
generating an output trace to depict a sequence of inputs and internal signals that produce a reachable target; and
when the target is unsolved or unreachable, providing additional relevant data obtained as a result of a verification run, including (a) number of simulation cycles run, or (b) number of steps from the initial state for which the targets cannot be hit.

11. The data processing system of claim 9, wherein said functions for comparing further comprises functions for:
performing exclusive OR operations between the first set of output signals representing the first electrical circuit design and a second set of output signals representing the modified first electrical circuit design.

12. The data processing system of claim 9, further comprising functions for:
  applying a correspondence checking algorithm to the composite design to provide a faster and more efficient comparison of the first electrical circuit design and the modified first electrical circuit design.

13. A computer program product comprising:
  non-transitory computer readable medium; and
  program code on said non-transitory computer readable medium that when executed within a data processing device, said program code provides the functionality of:
  developing a first electrical circuit design;
  creating a netlist data structure as a representation of the first electrical circuit design;
  generating a first set of target signatures of the netlist data structure or first electrical circuit design for a first verification run, according to a first set of input vectors;
  executing the first functional verification run for the first electrical circuit design;
  obtaining a status of one or more first targets from the first functional verification run;
  wherein said status of the one or more first targets represents a first set of outputs from the first verification run of the first electrical circuit design;
  modifying the first electrical circuit design;
  providing a modified netlist data structure for the modified first electrical circuit design;
  initiating a second functional verification run for the first electrical circuit design;
  generating a second set of target signatures of the first netlist data structure or first electrical circuit design, according to a second set of input vectors;
  determining whether a first set of target signatures are substantially identical to a second set of target signatures, respectively;
  when a first target signature is substantially identical to a second target signature, determining that a first target and a second target have a substantially identical functionality; and
  when a first target and a second target have the substantially identical functionality, re-using verification results associated with a corresponding first target to eliminate a formal verification re-run associated with the second target;
  performing an initial functional verification run for the modified first electrical circuit design;
  obtaining a second set of outputs from the initial functional verification run for the modified first electrical circuit design; and
  comparing a first set of outputs with a second set of outputs, respectively.

14. The computer program product of claim 13, wherein said program code for generating further comprises program code for:
  identifying one or more design targets based on a cone of influence (COI) procedure;
  creating a unique signature to represent a structural construction of a corresponding target, wherein said signature is a maximal-length-bounded digest;
  wherein said maximal-length-bounded digest represents a class of codes which includes:
  (a) Message-Digest algorithm 5 (MD5) hash codes; and (b) Cyclic Redundancy Check (CRC) codes; and
  determining when a second set of design data used to generate a second set of target signatures represents a change from the first set of design data used to generate a first set of target signatures by a utilization of a time-stamp check.

15. The computer program product of claim 13, wherein said program code for comparing further comprises program code for:
  creating a composite design using the first electrical circuit design and the modified first electrical circuit design;
  identifying a first set of inputs of the first electrical circuit design that correspond to a second set of inputs to the modified first electrical circuit design;
  connecting the first set of inputs of the first electrical circuit design that correspond to the second set of inputs to the modified first electrical circuit design;
  applying a sequence of vectors to the first electrical circuit design and the modified first electrical circuit design, wherein said sequence of vectors represents a complete and allowable set of primary inputs;
  detecting a first output signal of the first electrical circuit design and a second output signal of the modified first electrical circuit design, wherein said first output signal and said second output signal correspond to particular verification target;
  comparing the first output signal and the second output signal corresponding to the sequence of vectors;
  when the first output signal and the corresponding second output signal are substantially identical for a full duration of the sequence of vectors, determining that the first electrical circuit design and the modified first electrical circuit design have a substantially identical functionality associated with the particular verification target;
  when the first output signal and the corresponding second output signal are dissimilar for a segment of the sequence of vectors, determining that the first electrical circuit design and the modified first electrical circuit design have a dissimilar functionality associated with the particular verification target; and
  enabling generation of an output trace to depict a sequence of inputs and internal signals that produce a disparity between the first output signal and the second output signal.

16. The computer program product of claim 13, wherein said program code for developing further comprises program code for:
  creating a driver for one or more of the first electrical circuit design and the modified first electrical circuit design;
  developing random sequential logic for the driver to control inputs to the first electrical circuit design or the modified first electrical circuit design;
  filtering inputs to the first electrical circuit design or the modified first electrical circuit design to prevent illegal vectors or sequences of vectors from being applied to the inputs of the first electrical circuit design or the modified first electrical circuit design, by using the driver;
  providing checker logic for the driver to enable said driver to monitor design behavior via output signals including checker signals for specific intervals of time;
  indicating a status of a target based on a checker signal, wherein said status indicates one of: (a) the target is unreachable based on a current state of design; (b) the target is reachable; or (c) the target is unsolved;
  wherein said checker signals include checkstop signals;
  generating an output trace to depict a sequence of inputs and internal signals that produce a reachable target; and
  when the target is unsolved or unreachable, providing additional relevant data obtained as a result of a verification run, including (a) number of simulation cycles run, or (b) number of steps from the initial state for which the targets cannot be hit.

17. The computer program product of claim 15, wherein said program code for comparing further comprises program code for:
    performing exclusive OR operations between the first set of output signals representing the first electrical circuit design and a second set of output signals representing the modified first electrical circuit design.

18. The computer program product of claim 15, further comprising program code for:
    applying a correspondence checking algorithm to the composite design to provide a faster and more efficient comparison of the first electrical circuit design and the modified first electrical circuit design.

* * * * *